(12) United States Patent
Guo et al.

(10) Patent No.: US 11,527,708 B2
(45) Date of Patent: Dec. 13, 2022

(54) ULTRA-FAST MAGNETIC RANDOM ACCESS MEMORY HAVING A COMPOSITE SOT-MTJ STRUCTURE

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

(*) Notice: Subject to any disclaimer, the term of this patent is extended or adjusted under 35 U.S.C. 154(b) by 258 days.

(21) Appl. No.: 16/849,551

(22) Filed: Apr. 15, 2020

(65) Prior Publication Data
US 2021/0328134 A1 Oct. 21, 2021

(51) Int. Cl.
| | | |
|---|---|---|
| H01L 43/02 | (2006.01) | |
| G11C 11/16 | (2006.01) | |
| H01L 43/12 | (2006.01) | |
| H01L 43/08 | (2006.01) | |
| H01L 43/10 | (2006.01) | |
| H01L 27/22 | (2006.01) | |

(52) U.S. Cl.
CPC ............ H01L 43/02 (2013.01); G11C 11/161 (2013.01); G11C 11/1675 (2013.01); H01L 27/226 (2013.01); H01L 43/08 (2013.01); H01L 43/10 (2013.01); H01L 43/12 (2013.01)

(58) Field of Classification Search
CPC ....... H01L 43/02; H01L 27/226; H01L 43/08; H01L 43/10; H01L 43/12; G11C 11/161; G11C 11/1675

USPC .......................................................... 257/421
See application file for complete search history.

(56) References Cited

U.S. PATENT DOCUMENTS

| | | | |
|---|---|---|---|
| 9,953,692 B1* | 4/2018 | Mihajlovic | G11C 11/1675 |
| 10,748,562 B1* | 8/2020 | Chen | G01R 33/093 |
| 2019/0058111 A1* | 2/2019 | Shibata | G11C 11/161 |
| 2019/0074123 A1* | 3/2019 | Sasaki | G11C 11/1675 |
| 2019/0074124 A1* | 3/2019 | Ishitani | G11C 11/161 |
| 2019/0304524 A1* | 10/2019 | Oguz | H01L 43/08 |
| 2019/0363244 A1* | 11/2019 | Sasaki | G11C 11/18 |
| 2021/0074344 A1* | 3/2021 | Hu | H01F 10/329 |
| 2021/0142823 A1* | 5/2021 | Chen | G11B 5/3146 |
| 2021/0327960 A1* | 10/2021 | Xiao | G11C 11/1675 |

* cited by examiner

Primary Examiner — Jami Valentine Miller

(57) ABSTRACT

An ultra-fast magnetic random access memory (MRAM) comprises a three terminal composite SOT magnetic tunneling junction (CSOT-MTJ) element including a magnetic flux guide (MFG) having a very high magnetic permeability, a spin Hall channel (SHC) having a large positive spin Hall angle, an in-plane magnetic memory (MM) layer, a tunnel barrier (TB) layer, and a magnetic pinning stack (MPS) having a synthetic antiparallel coupling pinned by an antiferromagnetic material. The magnetic writing is significantly boosted by a combined effort of enhanced spin orbit torque (SOT) and Lorentz force generated by current-flowing wire (CFW) in the SHC layer and spin transfer torque (STT) by a current flowing through the MTJ stack, and further enhanced by a magnetic close loop formed at the cross section of MFG/SHC/MM tri-layer.

20 Claims, 4 Drawing Sheets

ULTRA-FAST MAGNETIC RANDOM ACCESS MEMORY HAVING A COMPOSITE SOT-MTJ STRUCTURE

BACKGROUND OF THE INVENTION

1. Field of the Invention

This invention relates to an ultra-fast magnetic random access memory having a composite SOT-MTJ structure with a magnetic flux guide underneath a spin Hall channel.

2. Description of the Related Art

In recent years, magnetic random access memories (hereinafter referred to as MRAMs) using the magnetoresistive effect of magnetic tunnel junctions (also called MTJs) have been drawing increasing attention as the next-generation solid-state nonvolatile memories that can also cope with high-speed reading and writing. A typical magnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

It has been known that a spin current can, alternatively, be generated in non-magnetic transition metal material by a so-called Spin Hall Effect (SHE), in which spin-orbit coupling causes electrons with different spins to deflect in different directions yielding a pure spin current transverse to an applied charge current. Recently discovered Giant Spin Hall Effect (GSHE), the generation of large spin currents transverse to the charge current direction in specific high-Z metals (such as Pt, $\beta$-Ta, $\beta$-W, doped Cu) is a promising solution to the voltage/current scaling down with semiconductor technology node and reliability problems in a spin-orbit-torque (SOT) MRAM.

One major source of SHE comes from spin-dependent scatterings in a thin non-magnetic transition metal layer, called Spin Hall Channel (SHC), in the presence of spin-orbital coupling. In another word, an electron scattering becomes spin-dependent when the spin-orbital interaction connected the spin of the electron gas to a spin particle outside of the equilibrium of the electron gas. When an electrical current is applied along the SHC, a transverse spin polarized current generated along the thickness direction leads to accumulations of oppositely polarized spins near the two surfaces of the SHC, respectively. However, the polarized spin gradient between the two surfaces starts to cause spin diffusions and it finally reaches a balanced amount of oppositely polarized spins near the two surfaces. Such a metallic layer or wire having a capability of large amount of spin accumulation at surfaces is also called SOT layer when it combines with an MTJ to form a memory cell or element. The parameter describing the efficiency of the spin-to-charge current conversion is the spin Hall angle. SOT-MRAM devices feature switching of the free magnetic layer immediately adjacent to a SOT layer, which is caused by the transverse spin polarized current across the free-layer-SOT-layer interface generated by injecting an in-plane electrical current in the adjacent SOT layer, unlike STT-MRAM where the electrical current is injected perpendicularly into the magnetic tunnel junction and the read and write operation is performed through the same path. Due to the thermal stability requirement, the recording layer is typically is patterned into an oval or ellipse like shape with an aspect ratio larger than 1.5 for a desired uni-axial shape anisotropy so that the magnetization of the recording layer has two stable energy minimum states. A spin torque coming from the Spin Hall Effect (SHE) has to be large enough to overcome a large energy barrier to switch the magnetization of the recording layer from one energy minimum state to the other energy minimum state, depending upon the spin Hall current direction.

Defining +x as the SHC wire longitudinal direction (positive electrical current flowing direction), +y as the SHC wire width direction and +z as direction normal to the film surface. There are three types of SOT-MRAMs (called type x, type y, and type z) where the relationship between magnetization easy axis direction and channel current direction differs. Among the three types of devices, magneticfield-free switching can be achieved in only the y-type, in which the easy axis direction is in-plane and perpendicular to channel current direction; while in the other two devices, one needs to apply either in-plane or out-of-plane external magnetic field for z-type and x-type devices, respectively. To achieve free-field switching, one way is to pattern the memory cell into an oval shape with its main long axis canted with an angle away from the current flowing direction (see J. Low Power Electron. Appl. 2018, 8, 44), and other way is to put part of the memory layer below the current flowing layer (see U.S. Pat. No. 9,941,468). Unfortunately, neither of these methods can help to improve switching speed while reducing writing current, which is urgently needed for ultra-fast and low power device application.

BRIEF SUMMARY OF THE PRESENT INVENTION

The invention discloses a composite SOT magnetic tunneling junction (CSOT-MTJ) element comprising a magnetic flux guiding (MFG) layer having a very high magnetic permeability, a spin Hall channel (SHC) having a large positive spin Hall angle, an in-plane magnetic memory (MM) layer, a tunnel barrier (TB) layer, and a magnetic pinning stack (MPS) 20 having a synthetic antiparallel coupled tri-layer magnetically pinned by an antiferromagnetic material. An ultra-fast magnetic writing (recording) is achieved by a combined effort of enhanced spin orbit torque (SOT) in the SHC, Lorentz force generated by current-flowing wire (CFW) of the SHC and further boosted by spin transfer torque (STT) from the MTJ stack. Its thermal stability is enhanced by a close magnetic loop across the MFG/SHC/MM tri-layer. The MFG layer also serves as a magnetic shield to reduce the magnetic stray field among neighboring elements. Here and thereafter throughout this application, each element written in the left side of "I" is stacked below an element written in the right side thereof.

Two methods of symmetry-breaking can be used to avoid using an external magnetic field for initial switch: In the first method, as-deposited CSOT-MTJ film stack is annealed with a magnetic field aligning at a canted angle in X-Y plane, while in the second method, the CSOT-MTJ recording cell is patterned into an oval shape with its long axis aligning at a canted angle in X-Y plane. The magnetization direction of the MM layer is reversible along its total anisotropy axis and two stable resistance states of the MTJ cell serve as "0" or "1" memory states.

An MRAM device comprises an array of CSOT-MTJ elements as well as a control circuitry. While main writing circuit between the two bottom electrodes (BE1 and B2) requires at least one transistor, read circuit can use a diode at the top electrode to save physical space for device miniaturization. Such a novel MRAM device will not only have an ultra-high switching speed, but also consume less power with a small size, suitable for level 1 or 2 cache applications in SMRAM, CPU, GPU and TPU.

DETAILED DESCRIPTION OF THE INVENTION

Figure 1:
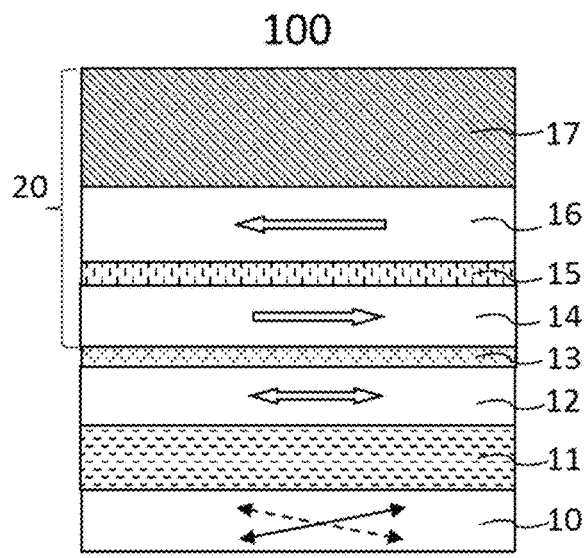
FIG. 1 Typical CSOT-MTJ film structure for the current invention.

The disclosed composite SOT magnetic tunneling junction (CSOT-MTJ) element comprises a film stack 100 (see FIG. 1), starting from a magnetic flux guiding (MFG) layer 10 deposited on a CMOS substrate, followed by a spin Hall channel (SHC) 11, a magnetic memory (MM) layer 12 having magnetic anisotropy in a direction in said film surface and having a variable magnetization direction, a tunnel barrier (TB) layer 13, a magnetic pinning stack (MPS) 20 having magnetic anisotropy in a film plane and having an invariable magnetization direction, and a cap (also as a hard mask) layer 17.

In above mentioned CSOT-MTJ element, said MFG layer 10 is made of a soft magnetic material having a very high magnetic permeability and comprising at least one element selected from the group of Ni, Fe, Co, and preferred to be selected from the group of NiFe, CoFe, NiCo and CoNiFe, or the group of NiFe, CoFe, Co, NiCo and CoNiFe doped with 0-30% of B, Si, Mo, Cr, Nb, Ta, Hf and having a thickness between 1.5-10 nm. The MFG layer 10 and the SHC layer 11 together are patterned into a rectangular shape with two longitudinal ends connected to its bottom electrodes. The magnetization of the MFG layer is normally aligned along either one of its two longitudinal directions of the MFG layer. Purposes of this MFG layer are to enhance the SOT effect for an easier switch as well as help the MM layer 12 form a magnetic flux closure, instead of magnetic dipole field diverging, for better thermal stability and less magnetic stray field acting on neighbor elements.

Above said spin Hall channel (SHC) 11 is made of a material having a large positive spin Hall angle, preferred to be selected from the group of (Au, Pt, Ir, Ag, Pd or Cu) doped with 5-15% (Ta, W, Hf or Bi), and having an electric resistivity lower than the electric resistivity of said MFG and having a thickness between 1.5-10 nm. For example, the resistivity of a SHC layer made of Au doped with 10% Ta is readily under 85 µOhm.cm which smaller than the resistivity of CoNbHf thin film layer (125 µOhm.cm). Although beta phase Ta and W have a negative large spin Hall angle, the negative spin torque generated will be counter-balanced partially by a Lorentz force generated by the current-flowing wire (CFW) in the SHC layer which will provide a weaker spin torque for memory layer switch. As an electrical current flows along the CSOT stack from one electrode to the other electrode, the majority current flows inside the SHC layer due to its lower resistivity. Due to the SHE, opposite polarized spin accumulations occur at the two surfaces of the SHC layer depending upon the electrically current direction. More specifically, accumulated polarized spins near its bottom interface are parallel to the width direction, while accumulated polarized spins near its top interface are antiparallel to above width direction. Since the magnetization in the MFG layer is in-plane and aligned its longitudinal direction, the accumulated polarized spins near SHC bottom interface flow or diffuse into the MFG layer and cause the magnetization in the MFG layer rotate away from its original longitudinal direction; while the accumulated polarized spins near SHC top interface is enhanced in the spin density and flow or diffuse into the MM layer and cause the magnetization in the MM layer switch to an opposite direction. Therefore, the critical writing current, as well as writing power, is reduced.

Above said magnetic memory (MM) layer 12 is made of a soft magnetic single layer or multilayer having a magnetic anisotropy in a direction in the film surface and having a variable magnetization direction; and comprising a material selected from CoFeB, FeB, Fe/CoFeB with a total thickness between 1.5-5 nm or a multilayer CoFeB(0.5-2 nm)/(W or Mo)(0.2-0.6 nm)/CoFeB(1-3 nm). The magnetization of MM layer is also magnetically coupled with the magnetization of the MFG layer, yielding an additional in-plane magnetic anisotropy along its width directions.

Above said tunnel barrier (TB) layer 13 is made of an oxide selected from MgO or MgZnO with a thickness between 1-2 nm. As compared with the MTJ stack used in pSTT-MTAM, in this MTJ stack, a thicker TB can be used to ensure a good device reliability because the write current does not go through the MTJ stack.

Above said magnetic pinning stack (MPS) 20 is a multilayer stack having magnetic anisotropy in a film plane and having an invariable magnetization direction and comprising a magnetic reference layer CoFeB/Co, FeB/Co, CoFeB/CoFe or FeB/CoFe, a RKKY coupling layer Ru, Rh or Ir, a pinned layer Co or CoFe and an antiferromagnetic material layer selected from PtMn, PtPdMn, NiMn, IrMn, RhMn, RuMn; and a preferred MPS is CoFeB(1-2 nm)/CoFe(1-1.5 nm)/Ru(0.4-0.85 nm)/CoFe(2-5 nm)/PtMn(5-20 nm).

There is also a cap layer (not shown in the figures) on top of the MPS 20 containing materials selected from Ta, Wu or Ru/Ta, Ru/W with a thickness between 30-100 nm, and the cap layer is also act as a hard mask for etching or milling during device patterning.

Figure 2:
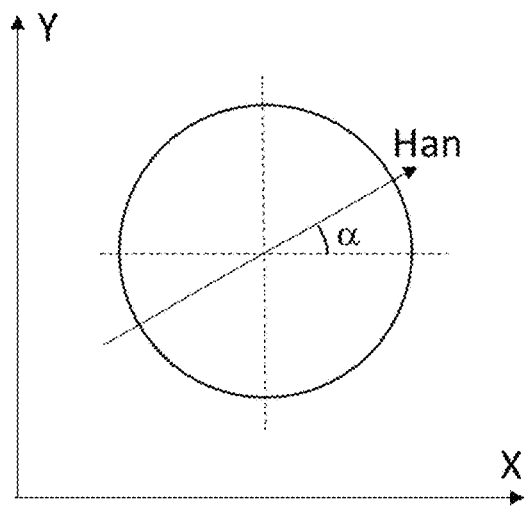
FIG. 2 Canted magnetic annealing to preset the pinning direction for the MTJ stack at an angle α in X-Y plane.

After film deposition, the above said CSOT-MTJ stack is annealed at a high temperature between 350-400 C for 30-120 minutes in the presence of a high magnetic field Han (1-5Tesla) to preset an initial aligning direction for the entire film stack. The field direction can be canted at an angle $\alpha$ (10-90 degree) within the X-Y plane (see FIG. 2) which is needed to avoid using an external magnetic field during memory switching.

Figure 3:
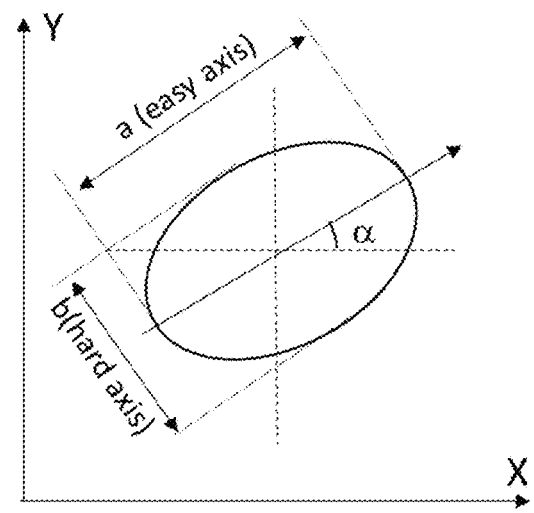
FIG. 3 Patterning of said CSOT-MTJ element with an oval shape to preset its long axis aligning at an angle α in X-Y plane.

The wafer with a CSOT-MTJ film stack is then photolithographically patterned and subsequently etched. To avoid using an external magnetic field during memory switching, the shape of the memory cell can also be made elliptical with an aspect ratio of 1.5-3 for its long(easy)/short(hard) (a/b) axes, and with its long a (magnetic easy) axis pointing (canted) at an angle $\alpha$ ranging between 10 to 90 degree in the X-Y plane (see FIG. 3), said X axis is the current flowing direction and Y is perpendicular to X; a preferred canting angle is 45 degree; wherein said canted annealing is needed to avoid using an external field at beginning of switching process.

There are two etching options: In the first one (see cross section stack 200 in FIG. 4A), etch is stopped at top surface of the SHC layer then immediately deposit a SiN protection layer (not shown in the figure) to cover the exposed MTJ surface and subsequently refill with SiO2 (18). In the second option (see stack cross section 250 in FIG. 4B): etch is stopped at MgO tunnel barrier layer followed by an oxidization process to convert the exposed portion of the memory layer into non-magnetic insulation layer (12-1). The underneath SHC layer is not affected since it contains Au which is inert to oxidation. Our preferred etching process is option two which yields a better current flow condition especially for thin SHC layer. After SiO2 refill, a CMP process is used to flatten the film surface and remove excess SiO2, followed by a Cu damascene process to form a top electrode 19.

Figure 4A:
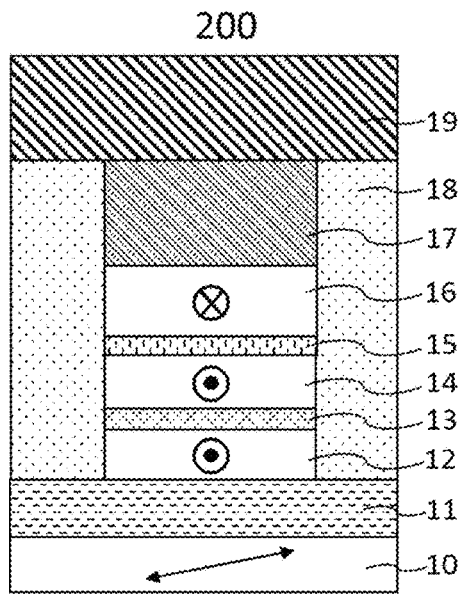
FIG. 4(A,B) Cross section view of a patterned CSOT-MTJ element, A: etch-stopped at the top surface of said SHC layer, B: etch-stopped at MgO tunnel barrier layer followed by oxidization of the exposed portion of memory layer.
Figure 4B:
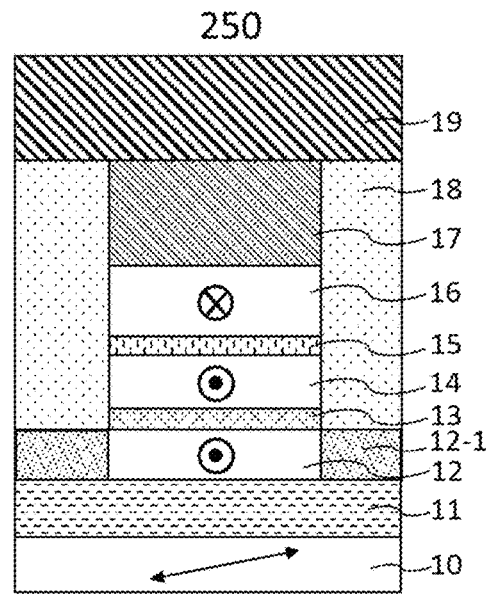

In FIGS. 4A and 4B, the two magnetic layers 14 (reference) and 16 (pinned) have their magnetic moment aligned in antiparallel across the Ru RKKY coupling layer 15, and the MM 12 is in a parallel state with the reference layer 14 resulting a low magnetoresistance state. The MFG layer 10 across the SHC layer 11, due to its magnetic softness and extremely high permeability, is always trying to align with the MM layer 12 to form a close-loop (see FIG. 5A) to help magnetic switching during memory writing. Without such a MFG layer, the magnetic flux outside the MM layer is diverging (see FIG. 5B) which will make it difficult to switch. And most importantly, with such a magnetic close loop, both the spin orbit torque and Lorentz force generated at upper SHC/MM interface and lower SHC/MFG interface will participate in the switching of the MM layer, more than twice magnitude of torque compared with the ones generated at the upper SHC/MM interface only.

Figure 5A:
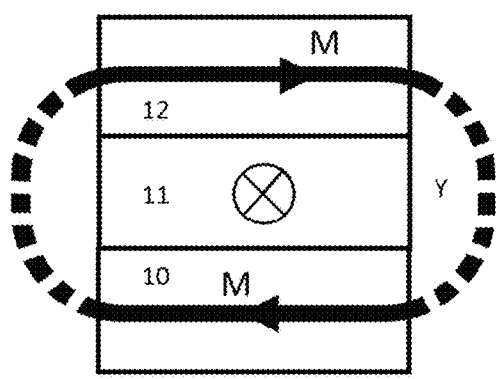
FIG. 5(A, B) Illustration of magnetic flux for the memory layer, A: with a MFG layer underneath the SHC, the magnetic flux forms a close loop, B: without a MFG layer, magnetic flux outside the memory layer is diverging.
Figure 5B:
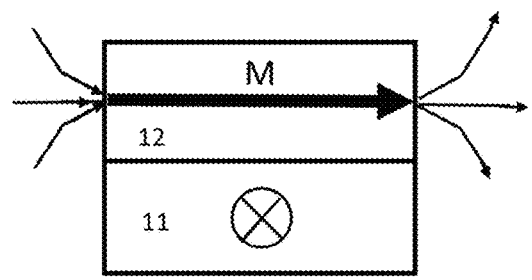
Figure 6A:
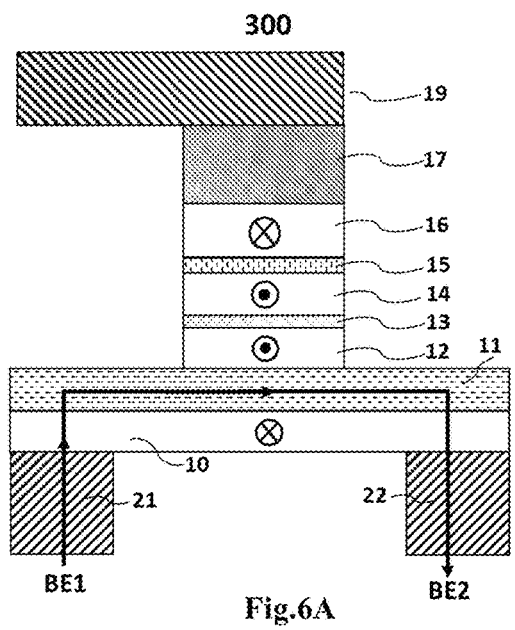
FIG. 6(A,B,C) Illustration of magnetic memory writing when a current passing through the SHC, A: a positive current flow writes the memory layer to a low magnetoresistance state, B: an opposite current flow writes the memory layer to a high magnetoresistance state, C: showing the two forces (SOT, CFW) simultaneously acting on the memory layer for a positive current flow.
Figure 6B:
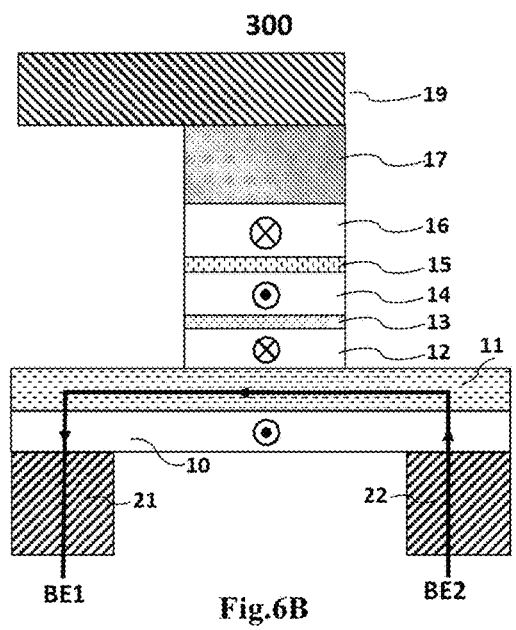
Figure 6C:
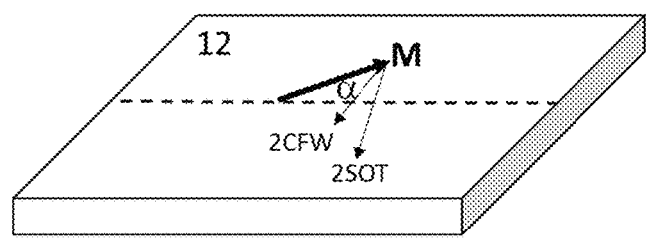

In FIG. 6A illustrate magnetic switching in a CSOT-MTJ stack 300 when a current is flowing through the SHC layer from BE1 (21) to BE2 (22) to write the MM layer 12 a low magnetoresistance (parallel with 14) state, while FIG. 6B is for an opposite case with a current flowing from BE2 to BE1 to write the MM layer 12 a high magnetoresistance (antiparallel with 14) state. As shown in FIG. 6C, when a current flowing from BE1 to BE2 in the SHC layer (FIG. 6A), there are 2×SOT and two current flow wire (CFW) generated Lorentz forces (2×CFW) acting on the MM layer 12 to switch its magnetic moment to a parallel state with the reference layer 14. With a small magnetic impedance in the closed magnetic loop as shown in FIG. 5A, magnetic polarization of the MM layer can be easily rotated to its final parallel state. Similarly with an opposite current flow in the SHC layer, the magnetic polarization of the MM will be switched to antiparallel state with the reference layer (see FIG. 6B).

Figure 7A:
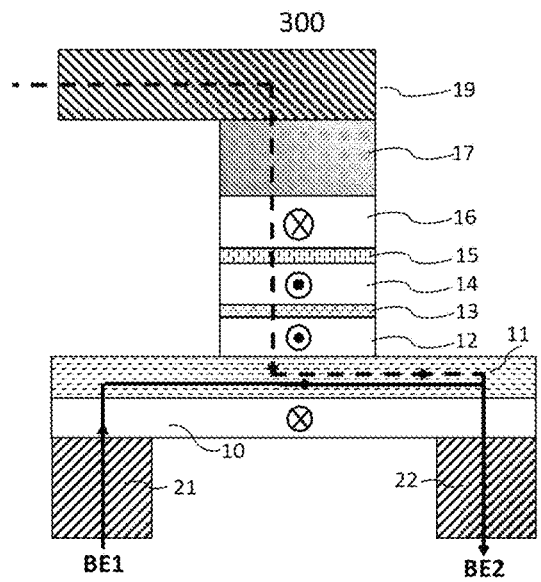
FIG. 7(A, B) A: Illustration of magnetic memory writing with one current laterally flowing through the SHC and another current perpendicularly flowing down from the MTJ stack to write a low magnetoresistance state, B: showing three forces simultaneously acting on the memory layer to switch its magnetic state.
Figure 7B:
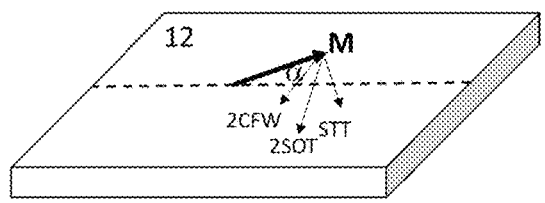

The magnetic switching of MM layer can be further enhanced by simultaneously passing through a current from top electrode (19) to BE2 (see FIG. 7A) 22 utilizing a spin transfer torque (STT) generated by the MTJ stack. Under such a write operation, there are 2SOT+2CFW+STT forces magnetically acting on the MM layer (see FIG. 7B) which make the switching even easier and faster.

Figure 8A:
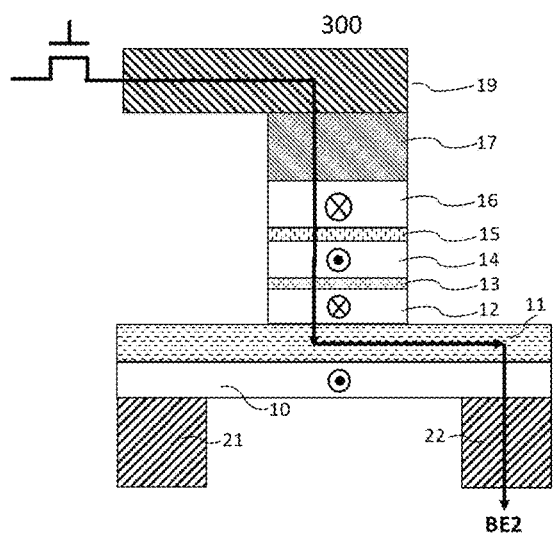
FIG. 8(A,B) Current flow from top electrode (TE) through the MTJ to BE2 during memory reading, A: a transistor is used for control, B: a diode is used.
Figure 8B:
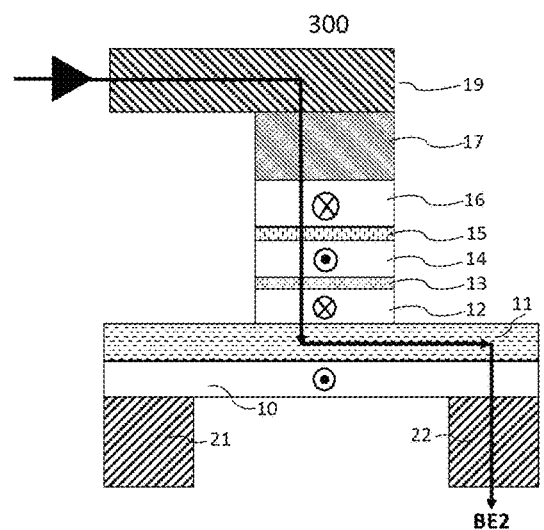

As for read operation, a current will pass through the MTJ stack from top electrode (19) down to BE2 (22). For the control of current flow, either a transistor (FIG. 8A) or diode (FIG. 8B) can be used for such operation. From the point of device miniaturization and cost of manufacturing, using a diode is more economic, thus only on transistor one diode (1T1D) is needed for each MRAM-SE unit.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A composite spin-orbit torque (SOT) magnetic tunneling junction (CSOT-MTJ) element comprises:
   a CMOS substrate;
   a composite SOT (CSOT) stack comprising at least a magnetic flux guiding (MFG) layer provided atop said CMOS substrate and a spin Hall channel (SHC) layer provided atop said MFG;
   a magnetic memory (MM) layer provided atop said CSOT stack and having magnetic anisotropy in a film plane and having a variable magnetization direction;
   a tunnel barrier (TB) layer provided atop said MM layer;
   a magnetic pinning stack (MPS) provided atop said TB layer having magnetic anisotropy in a film plane and having an invariable magnetization direction; and
   a cap layer provided atop said MPS as top electrode (TE).

2. The element of claim 1, wherein said MFG layer comprises a soft magnetic material layer having a very high magnetic permeability and comprising at least one element selected from the group of Ni, Fe, Co, and preferred to be selected from the group of NiFe, CoFe, NiCo, CoNiFe, and alloys thereof doped with a dopant having a atomic percentage less than 30% and comprising an element selected from B, Si, Mo, Cr, Nb, Ta, Hf, and having a thickness between 1.5 nm and 10 nm.

3. The element of claim 1, wherein said SHC comprises a spin Hall material layer having a large positive spin Hall angle, preferred to comprise a nobel metal selected from Au, Pt, Ir, Ag, Pd, Cu and doped with a dopant having an atomic percentage between 5% and 15% and comprising an element selected from Ta, W, Hf, and having an electric resistivity lower than the electric resistivity of said MFG and having a thickness between 1.5 nm and 10 nm.

4. The element of claim 1, wherein said MM is made of a soft magnetic layer having a magnetic anisotropy in a direction in the film surface and having a variable magnetization direction, and comprising at least one selected from CoFeB, FeB, Fe/CoFeB, CoFeB/W/CoFeB, CoFeB/Mo/CoFeB, and having a total thickness between 1.5 nm and 5 nm.

5. The element of claim 1, wherein said TB is made of an oxide layer selected from MgO and MgZnO, and having a thickness between 0.7 nm and 2 nm.

6. The element of claim 1, wherein said MPS is a multilayer stack having magnetic anisotropy in a film plane and having an invariable magnetization direction and comprising a magnetic reference layer selected from CoFeB/Co, FeB/Co, CoFeB/CoFe, FeB/CoFe, a RKKY coupling layer selected from Ru, Rh, Ir, a pinned layer selected from Co, CoFe, and an antiferromagnetic material layer selected from PtMn, PtPdMn, NiMn, IrMn, RhMn, RuMn; and said MPS is preferred to be CoFeB(1-2 nm)/CoFe(1-1.5 nm)/Ru(0.4-0.85 nm)/CoFe(2-5 nm)/PtMn(5-20 nm).

7. The element of claim 1, wherein said cap layer comprises a material selected from Ta, Wu, Ru/Ta, Ru/W, and having a thickness between 30 nm and 100 nm.

8. The element of claim 1, wherein said CSOT-MTJ element further comprises a three-terminal electric circuit having three terminals:
   a first bottom electrode (BE1) provided on a first side of said CSOT stack and electrically connected to said CSOT stack;
   a second bottom electrode (BE2) provided on a second side of said CSOT stack and electrically connected to said CSOT stack; and
   a top electrode (TE) provided on the top surface of the cap layer.

9. The element of claim 8, wherein said three-terminal electric circuit is electrically connected to at least one CMOS transistor through one of said first bottom electrodes (BE1) and said second bottom electrode (BE2) and electrically connected to a bit line through said top electrode (TE).

10. The element of claim 8, wherein said three-terminal electric circuit provides a first spin current flowing from said BE1 to said BE2 during a high resistance (anti-parallel) state writing of said CSOT-MTJ element, and provides a second spin current flowing from said BE2 to said BE1 during a low resistance (parallel) state writing of said CSOT-MTJ element, when said TE remains open.

11. The element of claim 10, wherein both said high (anti-parallel) resistance state writing and said low (parallel) resistance state writing of said CSOT-MTJ element comprise effects of a spin orbit torque (SOT), a Lorentz force and a magnetic field produced by a close magnetic flux loop from said MFG/SHC/MM tri-layer.

12. The element of claim 8, wherein said three-terminal electric circuit provides a third spin current flowing from said BE1 to said BE2 and a fourth spin current flowing from said TE down to said BE2 simultaneously during a high (anti-parallel) resistance state writing of said CSOT-MTJ element, and provides a fifth spin current flowing from said BE2 to said BE1 and a sixth spin current flowing from said BE2 up to said TE simultaneously during a low resistance (parallel) state writing of said CSOT-MTJ element.

13. The element of claim 12, wherein both said high resistance state writing and said low resistance state writing of said CSOT-MTJ element comprise effects of a spin orbit torque (SOT), a Lorentz force, a spin transfer torque (STT), and a magnetic field produced by a close magnetic flux loop from said MFG/SHC/MM tri-layer.

14. The element of claim 8, wherein said three-terminal electric circuit provides a read current flowing from said top electrode down to said BE2 during a magnetic state reading of said CSOT-MTJ element when said BE1 remains open.

15. The element of claim 1, wherein said CSOT-MTJ element is used in application for one of SMRAM, CPU, GPU and TPU.

16. A method of manufacturing a composite SOT magnetic tunneling junction (CSOT-MTJ) element comprising:
   forming a composite SOT (CSOT) stack atop a CMOS substrate and comprising a magnetic flux guiding (MFG) layer atop said CMOS substrate and a spin Hall channel (SHC) layer atop said MFG layer;
   forming a magnetic memory (MM) layer atop said SHC and having magnetic anisotropy in a film plane and having a variable magnetization direction;

forming a tunnel barrier (TB) layer atop said MM layer;
forming a magnetic pinning stack (MPS) atop said TB layer having magnetic anisotropy in a film plane and having an invariable magnetization direction; and
forming a cap layer atop said MPS as a top electrode (TE).

17. The element of claim 16, further comprising conducting a photo-lithographic patterning process, wherein said CSOT-MTJ element is photo-lithographically patterned into an oval shape with an aspect ratio of 1.5-3 for its long(easy)/short(hard) (a/b) axes by said photo-lithographic process, and having long axis pointing (canted) at an angle α ranging between 10 and 90 degree in the X-Y plane, said X axis is the current flowing direction and Y is perpendicular to X; a preferred canting angle is 45 degree.

18. The element of claim 17, wherein said photo-lithographic patterning process comprises a first patterning and a first etching down to the top surface of said SHC to form magnetic recording bits, and a second patterning and a second etching through said SHC and said MFG to form a current flow channel underneath said MM layer.

19. The element of claim 17, wherein said photo-lithographic patterning process comprises a first patterning and a first etching down to the MgO barrier layer and an oxidizing the etch-exposed surface of said MM layer to convert it into a non-magnetic insulating layer, and a second patterning and a second etching through said SHC and said MFG to form a current flow channel underneath said MM layer.

20. The element of claim 16, wherein said MFG, said SHC and said MM form a close magnetic flux loop.

* * * * *